(12) United States Patent
Goto et al.

(10) Patent No.: US 7,525,071 B2
(45) Date of Patent: Apr. 28, 2009

(54) POWER-SUPPLYING MEMBER AND HEATING APPARATUS USING THE SAME

(75) Inventors: Yoshinobu Goto, Nagoya (JP); Hideyoshi Tsuruta, Tokai (JP)

(73) Assignee: NGK Insulators, Ltd., Nagoya-shi (JP)

( * ) Notice: Subject to any disclaimer, the term of this patent is extended or adjusted under 35 U.S.C. 154(b) by 440 days.

(21) Appl. No.: 11/406,084

(22) Filed: Apr. 18, 2006

(65) Prior Publication Data

US 2006/0231034 A1  Oct. 19, 2006

Related U.S. Application Data

(60) Provisional application No. 60/672,737, filed on Apr. 19, 2005.

(30) Foreign Application Priority Data

Apr. 14, 2006 (JP) .............................. 2006-111542

(51) Int. Cl.
*H05B 3/16* (2006.01)
*C23C 16/00* (2006.01)

(52) U.S. Cl. ................. 219/543; 219/444.1; 219/465.1; 219/466.1; 219/467.1; 219/544; 219/546; 118/724; 118/725; 118/728

(58) Field of Classification Search ............... 219/444.1, 219/465.1, 466.1, 467.1, 543–4, 546; 118/724–5, 118/728
See application file for complete search history.

(56) References Cited

U.S. PATENT DOCUMENTS

| 5,331,134 A | 7/1994 | Kimura |
| 6,753,507 B2 * | 6/2004 | Fure et al. ................. 219/444.1 |
| 2005/0040039 A1 | 2/2005 | Kojima et al. |

FOREIGN PATENT DOCUMENTS

| CN | 1584577 | | 2/2005 |
| JP | 05-326112 A1 | | 12/1993 |
| JP | 2000-055462 | | 2/2000 |
| KR | 2002-084407 A1 | | 11/2002 |
| KR | 2003-8235 | * | 1/2003 |
| KR | 2003-008235 A1 | | 1/2003 |

* cited by examiner

*Primary Examiner*—Shawntina Fuqua
(74) *Attorney, Agent, or Firm*—Burr & Brown (57) ABSTRACT

A power-supplying member comprises: a first rod-shaped member connected to power-supplied object; a second rod-shaped member connected to power supply; and a thermal-expansion absorbing member, which is disposed between the first rod-shaped member and the second rod-shaped member, and which shrinks in a longitudinal direction in response to changes in shape of the first rod-shaped member and the second rod-shaped member in the longitudinal direction due to thermal expansion.

5 Claims, 8 Drawing Sheets

| EXAMPLE 1 | FIRST ROD-SHAPED MEMBER | SECOND ROD-SHAPED MEMBER | THERMAL-EXPANSION ABSORBING MEMBER |
|---|---|---|---|
| MATERIAL | Ni | Ni | Ni |
| YOUNG'S MODULUS (Gpa) | 205 | 205 | 205 |
| DIFFERENCE (Gpa) | 0 | | |
| PITCH | | | 5 |
| AMPLITUDE | | | 2 |
| AMPLITUDE / PITCH | | | 0.4 |
| LENGTH IN LONGITUDINAL DIRECTION (mm) | 200 | 10 | 30 |
| SHAPE OF CROSS SECTION | φ5mm | | RECTANGULAR (5×0.3mm) |
| POWER-SUPPLYING TERMINAL | | NO DISCONNECTION | |

FIG. 9B

| EXAMPLE 2 | FIRST ROD-SHAPED MEMBER | SECOND ROD-SHAPED MEMBER | THERMAL-EXPANSION ABSORBING MEMBER |
|---|---|---|---|
| MATERIAL | Ni | Ni | Cu |
| YOUNG'S MODULUS (Gpa) | 205 | 205 | 110 |
| DIFFERENCE (Gpa) | 95 | | |
| PITCH | | | |
| AMPLITUDE | | | |
| AMPLITUDE / PITCH | | | |
| LENGTH IN LONGITUDINAL DIRECTION (mm) | 200 | 10 | 30 |
| SHAPE OF CROSS SECTION | φ5mm | | φ5 |
| POWER-SUPPLYING TERMINAL | | NO DISCONNECTION | |

FIG. 9C

EXAMPLE 3

| | FIRST ROD-SHAPED MEMBER | SECOND ROD-SHAPED MEMBER | THERMAL-EXPANSION ABSORBING MEMBER |
|---|---|---|---|
| MATERIAL | Ni | Ni | Al |
| YOUNG'S MODULUS (GPa) | 205 | 205 | 69 |
| DIFFERENCE (GPa) | | 136 | |
| PITCH | | | |
| AMPLITUDE | | | |
| AMPLITUDE / PITCH | | | |
| LENGTH IN LONGITUDINAL DIRECTION (mm) | 200 | 10 | 30 |
| SHAPE OF CROSS SECTION | φ5mm | | φ5 |
| POWER-SUPPLYING TERMINAL | | NO DISCONNECTION | |

FIG. 10A

| | COMPARATIVE EXAMPLE 1 | |
|---|---|---|
| | | ROD-SHAPED MEMBER |
| MATERIAL | | Ni |
| YOUNG'S MODULUS(Gpa) | | 205 |
| DIFFERENCE(Gpa) | | |
| PITCH | | |
| AMPLITUDE | | |
| AMPLITUDE/PITCH | | |
| LENGTH IN LONGITUDINAL DIRECTION (mm) | | 240 |
| SHAPE OF CROSS SECTION | | φ5mm |
| POWER-SUPPLYING TERMINAL | TWO TERMINALS DISCONNECTED | |

FIG. 10B

| | COMPARATIVE EXAMPLE 2 | | |
|---|---|---|---|
| | FIRST ROD-SHAPED MEMBER | SECOND ROD-SHAPED MEMBER | THERMAL-EXPANSION ABSORBING MEMBER |
| MATERIAL | Ni | Ni | SU316 |
| YOUNG'S MODULUS(Gpa) | 205 | 205 | 193 |
| DIFFERENCE(Gpa) | | | 12 |
| PITCH | | | |
| AMPLITUDE | | | |
| AMPLITUDE/PITCH | | | |
| LENGTH IN LONGITUDINAL DIRECTION (mm) | 200 | 10 | 30 |
| SHAPE OF CROSS SECTION | φ5mm | | φ5 |
| POWER-SUPPLYING TERMINAL | ONE TERMINAL DISCONNECTED | | |

POWER-SUPPLYING MEMBER AND HEATING APPARATUS USING THE SAME

CROSS REFERENCE TO RELATED APPLICATIONS

This application is based upon and claims the benefit of priority from provisional application 60/672,737 filed on Apr. 19, 2005, and Japanese patent application No. Tokugan 2006-111542 filed on Apr. 14, 2006; the entire contents of which are incorporated by reference herein.

BACKGROUND OF THE INVENTION

1. Field of the Invention

The present invention relates to a power-supplying member and a heating apparatus using the same, suitable for semiconductor manufacturing systems such as thermal chemical Vapor Deposition (CVD) systems and plasma CVD systems.

2. Description of the Related Art

There is conventionally known, as disclosed in Japanese Patent Application Laid-Open No. H5-326112, heating apparatuses (hereinafter referred to as "ceramic heaters") comprise a ceramic base in which a heating resistor oz an electrode are embedded; a tubular supporting member which supports the ceramic base; and a power-supplying member which is disposed to a hollowed part in the tubular supporting member, and which supplies power to the heating resistor or the electrode. According to the ceramic heaters of the related art, an end of the power-supplying member formed from a nickel or a nickel-base alloy is connected to the heating resistor or the electrode, and the ocher end of the power-supplying member is connected to the power supply through the connector or the like.

However, according the ceramic heaters of the related art, the power-supplying member and the tubular supporting member are different in material and temperature in use. This brings about a problem that the difference between the power-supplying member and the tubular supporting member in amount of thermal expansion is large. In addition, as mentioned above, an and of the power-supplying member is connected to the heating resistor or the electrode, and the other end of the power-supplying member is connected to the power supply through the connector or the like. Moreover, the other end of the power-supplying member in supported and held by O-ring seal to hermetically hold a chamber.

For this reason, according to the ceramic heaters of the related art, as the power-supplying member cannot freely expand thermally in response to temperature change, excessive stress occurs in a joint part where the heating resistor or the electrode is joined to the power-supplying member. The occurrence of the stress brings about a problem that the stress disconnects a power-supplying member from the heating resistor or the electrode (terminal disconnection), and a problem that the stress causes critical cracks in the ceramic base in the vicinity of the joint part. Accordingly, the ceramic heaters of the related art have a problem in reliability.

It is an object of the present invention to provide a power-supplying member that can improve reliability of a heating apparatus and a heating apparatus using the same.

SUMMARY OF THE INVENTION

A power-supplying member according to the present invention is disposed to a hollowed part in a tubular-supporting member, and supplies power to at least one of a heating resistor and an electrode which are embedded in a ceramic base supported by the supporting member. The power-supplying member comprises a first rod-shaped member connected to power-supplied object; a second rod-shaped member connected to power supply; and a thermal-expansion absorbing member, which is disposed between the first rod-shaped member and the second rod-shaped member, and which shrinks in a longitudinal direction in response to changes in shape of the first rod-shaped member and the second rod-shaped member in the longitudinal direction due to thermal expansion.

A heating apparatus according to the present invention comprises a ceramic base in which at least one of a heating resistor and an electrode is embedded; a tubular supporting member which supports the ceramic base; and a power-supplying member, which is disposed to a hollowed part in the tubular supporting member, and which supplies power to power-supplied object. The power-supplying member comprises a first rod-shaped member connected to the power-supplied object; a second rod-shaped member connected to a power supply; and a thermal-expansion absorbing member, which is disposed between the first rod-shaped member and the second rod-shaped member, and which shrinks in a longitudinal direction in response to changes in shape of the first rod-shaped member and the second rod-shaped member in the longitudinal direction due to thermal expansion.

According to the present invention, as shrink properties can be given to power-supplying member, the power-supplying member can absorb an amount of change in shape due to its thermal expansion by shrink of the thermal-expansion absorbing member, even in a case where power supply generates heat on the power-supplying member, and thus the power-supplying member thermally expands, while the power-supplying member is connected to the power supplied object. Accordingly, the power-supplying member of the present invention makes it possible to improve reliability of the heating apparatus.

It is desirable that the thermal-expansion absorbing member is a member formed in any one of a structure spiraling a rod-shaped member, a structure spiraling a thin-plate member, and a structure which the thin-plate member has alternating series of convex and concave bending portion in the longitudinal direction, each bending portion extending along a direction orthogonal to the longitudinal direction. According to such a structure, as spring properties can be given to the thermal-expansion absorbing member, the thermal-expansion absorbing member can adequately shrink in response to thermal expansion. Accordingly, it is possible to absorb an amount of change in shape of the power-supplying member due to its thermal expansion.

The thermal expansion absorbing member may include a curved portion. According to such a structure, the power-supplying member can be provided with a structure having spring properties or a structure capable of causing the thermal-expansion absorbing member to easily buckle, while maintaining the hardness of the power-supplying member as a whole without necessitating change in the cross-sectional form of the thermal-expansion absorbing member. As a result, the thermal-expansion absorbing member can adequately shrink or buckle in response to change in shape due to its thermal expansion. Accordingly, this makes it possible to absorb an amount of change in shape of the power-supplying member due to the thermal expansion.

It is desirable that the thermal-expansion absorbing member is formed from a member which Young's modulus is 50 [Gpa] or more smaller then Young's modulus of the first and second rod-shaped member. According to such a structure, the thermal-expansion absorbing member can shrink more easily and can adequately shrink in response to cleanse in shape due to its thermal expansion thermal expansion. As a result, this makes it possible to absorb an amount of change in shape of the power-supplying member due to the thermal expansion.

It is desirable that the ratio of distance a between a convex bending portion and an adjacent concave bending portion in a direction orthogonal to the longitudinal direction to distance p between a convex bending portion and the next convex bending portion in the longitudinal direction is not smaller than 0.2, but not larger than 2.

BRIEF DESCRIPTION OF THE DRAWINGS

Exemplary embodiments of the invention will become more fully apparent from the following description and appended claims, taken in conjunction with the accompanying drawings. Understanding that these drawings depict only exemplary embodiments and are, therefore, not to be considered limiting of the invention's scope, the exemplary embodiments of the invention will be described with additional specificity and detail through use of the accompanying drawings in which:

DETAILED DESCRIPTION OF THE INVENTION

Hereinafter, descriptions will be provided for embodiments of the present invention with reference to the drawings. While the following descriptions will be described, the same or similar reference numerals will be used to designate the same or similar components. The power-supplying member according to the present invention is a power-supplying member having the diameter D, the cross-sectional area S in the axis direction, and the length L. However, the drawings are schematic. It should be noted that ratios among dimensions of the power-supplying member shown in each of the drawings are different from real ones. Specific dimensions and the like of the power-supplying members need to be estimated with the following descriptions taken into consideration. In addition, it goes without saying that dimensional relationships and ratios are different from one drawing to another as well. The power-supplying members according to the present invention are circular in cross-sectional shape in the axis direction, unless otherwise specified. However, the power-supplying members according to the present invention may be rectangular or elliptical in cross-sectional shape in the axis direction. In such a case, the diameter of a circle having an area equal to that of a rectangle or ellipse is defined as an equivalent diameter D.

FIRST EMBODIMENT (Configuration of Power-Supplying Member)

Figure 1:
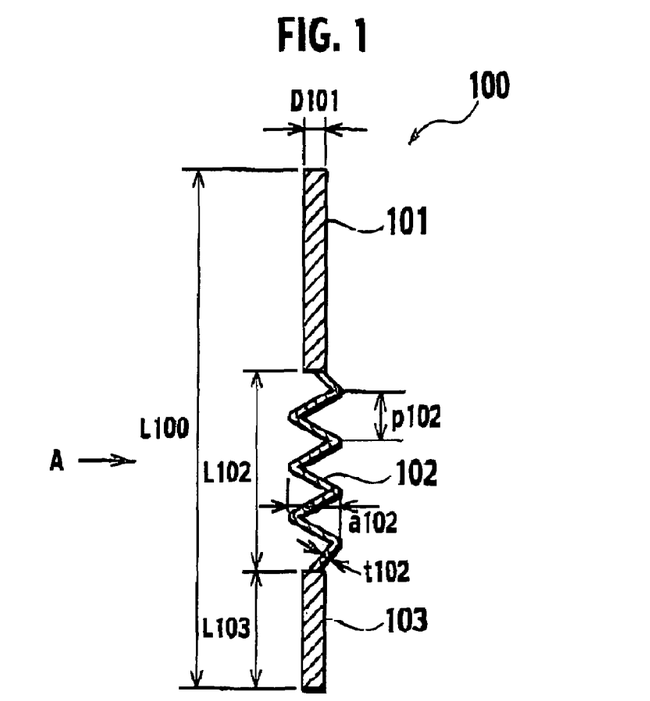
FIG. 1 is a side view of a power-supplying member according to first embodiment or the present invention.
Figure 2:
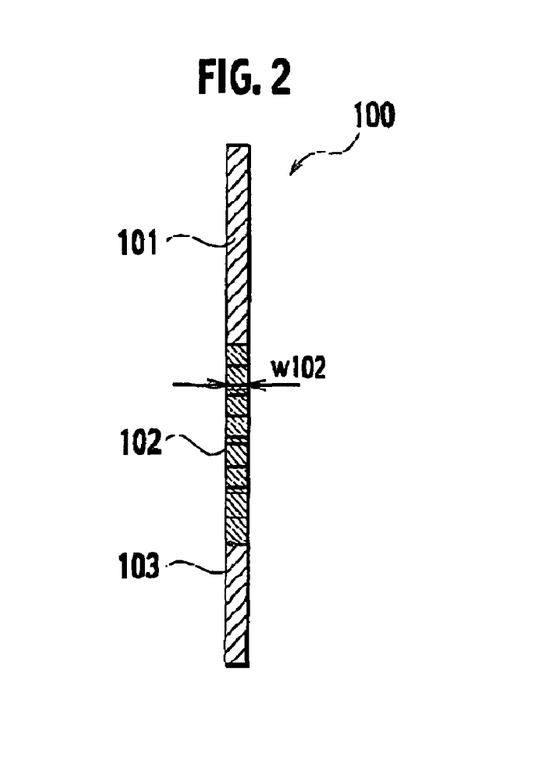
FIG. 2 is another side view of a power-supplying member according to first embodiment of the present invention.
Figure 3:
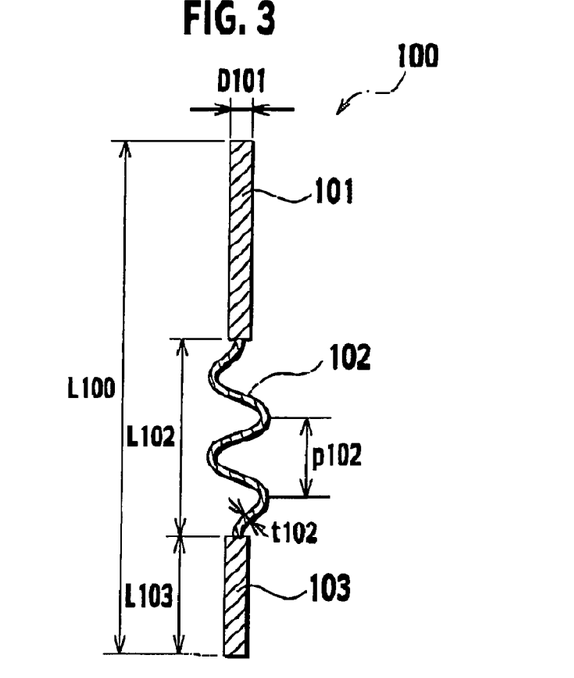
FIG. 3 is a side view of a power-supplying member according to application example of the power-supplying member shown in FIG.1.

Descriptions will be provided for a power-supplying member according to first embodiment of the present invention with reference to FIGS. 1 and 2. FIG. 1 shows a side view of the power-supplying member, and FIG. 2 shows a side view of the power-supplying member in the case the power-supplying member is viewed from direction A shown in FIG. 1.

The power-supplying member 100 according to first embodiment is disputed to a hollowed part in a tubular supporting member. A heating resistor and an electrode are embedded in a ceramic base to be supported by the supporting member. The power-supplying member 100 supplies power to at least one of the heating resistor and the electrode as power-supplied object. As shown in FIGS. 1 and 2, the power-supplying member 100 includes a first rod-shaped member 101, a second rod-shaped member 103 and a thermal-expansion absorbing member 102. The first rod-shaped member 101 is connected to the power supplied object. The second rod-shaped member 103 is connected to power supply. The thermal-expansion absorbing member 102 is disposed between the first rod-shaped member 101 and the second rod-shaped member 103. The thermal-expansion absorbing member 102 shrinks in the longitudinal direction in response to changes in shape of the first rod-shaped member 101 and the second rod-shaped member 103 in their longitudinal directions due to their thermal expansions.

It is desirable that the power-supplying member 100 should have higher resistance to heat, and that the power-supplying member 100 should have lower electric resistivity so that the supplying member 100 should not generate heat even though high electric current flows through the supplying member 100. In this case, the "high electric current" is not lower than 10 [A], but not higher than 50 [A] at maximum. With this taken into consideration, the power-supplying member 100 is formed of a Ni-base heat-resistant alloy. With the Ni-base heat-resistant alloy, it is desirable that purity of nickel should be not lower than 99 [%].

It is desirable that the diameter D101 of the first rod-shaped member 101 and the second rod-shaped member 103 should be larger for the purpose of making their electric resistivity smaller. However, it is desirable that the diameter D101 of the first rod-shaped member 101 and the second rod-shaped member 103 should be not smaller than 1 [mm], but not larger than 10 [mm]. That is because the power-supplying member 100 along with a heating-resistor power-supplying member and the like is disposed to the hollowed part in the tubular supporting member.

The length L102 of thermal-expansion absorbing member 102 in the longitudinal direction is not shorter than 3 [mm]. However, it is desirable that such a length L102 should be not shorter than 3 [mm], but not longer than 50 [mm]. This is because, in a case where the length L102 is too short, it is likely that the thermal-expansion absorbing member 102 may break as excessive stress occurs repeatedly. In addition, in a case where the length L102 is too long, it becomes hard to join to a connector.

The thermal-expansion absorbing member 102 is a member obtained by forming a thin-plate member with a structure having an alternating series of convex and concave bending portion in the longitudinal direction. Each bending portion extends along a direction orthogonal to the longitudinal direction. No specific restriction is imposed on the form of the bending portion. For example, the bending portion can be formed like a triangle or a sine curve. The number n of the bending portion is one to 50. This is because the number of the bending portion depends on the amount or change in shape of the power-supplying member 100 in the longitudinal direction due to thermal expansion. In particular, it is desirable that the number n of the bending portion should be one to 10.

The pitch p102 from a convex bending portion to the next convex bending portion of the thermal-expansion absorbing member 102 is calculated on the basis of what is obtained by dividing a value on the length L102 by a value on the number n of the bending portion. When the longitudinal distance from a convex bending portion to an adjacent concave bending portion of the thermal-expansion absorbing member 102 is defined as an amplitude a, a ratio of the amplitude a to the pitch p is not smaller than 0.2, but not larger than 2. The larger the amplitude a is, the better the amplitude a is. This is because the amount of change in shape of the power-supplying member 100 in the longitudinal direction due to thermal expansion needs to be reduced. In a case where the amplitude a of the power-supplying member 100 is too large, the thin-plate member is easy to be cracked. In addition, the power-supplying member 100 cannot be held in the hollowed part in the supporting member, to which the power-supplying member 100 is disposed. For this reason, it is desirable that the ratio of the amplitude a to the pitch p should be not smaller than 0.2, but not larger than 1.5.

It is desirable that the thermal-expansion absorbing member 102 should be held in an environment as cool as possible. Specifically, the second rod-shaped member 103 is connected to the power supply, and is held in a cool environment. In addition, the length L103 of the second rod-shaped member 103 in the longitudinal direction is not shorter than 1 [mm] but not longer than 100 [mm]. For this reason, the thermal-expansion absorbing member 102 can be held in the cool environment. It is desirable that the length L103 should be not shorter than 3 [mm], but not longer than 50 [mm].

The width w102 of the thermal-expansion absorbing member 102 is equal to, or not wider than, the diameter D101 of the first rod-shaped member 101 and the second rod-shaped member 103. The thickness t102 of the thermal-expansion absorbing member 102 is not thicker than 3 [mm]. However, in a case where the value on the width w102 and the value on the thickness t102 are too small, it is likely that the thermal-expansion absorbing member 102 may break before long while the thermal-expansion absorbing member 102 shrinks in the longitudinal direction repeatedly. For this reason, it is desirable that the width w102 should be not narrower than 1 [mm], but not wider than the diameter D101, In addition, it is desirable that the thickness t102 should be not thinner than 0.2 [mm], but not thicker than 2 [mm]

(Method of Manufacturing Power-Supplying Member)

Descriptions will be provided for a method of manufacturing the power-supplying member.

In manufacturing the power-supplying member, first of all, a rod-shaped member obtained by integrating the first rod-shaped member 101, the thermal-expansion absorbing member 102 and the second rod-shaped member 103 is produced, and a part of the rod-shaped member is scraped in order that the part of the rod-shaped member can be termed into a thin-plate member. Next, the resultant thin-plate member is pressed against a mold with a structure having an alternating series of convex and concave bending portion in a longitudinal direction. Each bending portion extends along a direction orthogonal to the longitudinal direction. Thereby, the thermal-expansion absorbing member 102 is formed. The power-supplying member 100 can be produced in this manner. The power-supplying member 100 can be produced by fixing the thermal-expansion absorbing member 102 to the first rod-shaped member 101 and the second rod-shaped member 103 by welding or soldering, after forming the thermal-expansion absorbing member 102 by pressing a thin-plate member against the mold.

As is clear from the above description, according to the first embodiment of the present invention, shrink properties can be given to the power-supplying member 100. This is because the power-supplying member 100 is provided with the first rod-shaped member 101, the second rod-shaped member 103 and the thermal-expansion absorbing member 102. The first rod-shaped member 101 is connected to power-supplied object. The second rod-shaped member 103 is connected to the power supply. The thermal-expansion absorbing member 102 is disposed between the first rod-shaped member 101 and the second rod-shaped member 103. The thermal-expansion absorbing member 102 shrinks in the longitudinal direction in response to changes in shape of the first rod-shaped member 101 and the second rod-shaped member 103 in their longitudinal direction due to their thermal expansion.

Thereby, the power-supplying member 100 can absorb an amount of change in shape due to its thermal expansion by shrink of the thermal-expansion absorbing member 102, even in a case where power supply generates heat on the power-supplying member 100, old thus the power-supplying member 100 thermally expands, while the power-supplying member 100 is connected to the power supplied object. Accordingly, provision of the power-supplying member 100 with the structure capable of absorbing an amount of change in shape makes it possible to improve reliability of the heating apparatus.

In addition, the thermal-expansion absorbing member 102 can be provided with a structure having spring properties. This is because the thermal-expansion absorbing member 102 is a member obtained by forming the thin-plate member with the structure having the alternating series of convex and concave bending portion in the longitudinal direction. Each bending portion extends along a direction orthogonal to the longitudinal direction. Thereby, the thermal-expansion absorbing member 102 can shrink adequately in response to thermal expansion. Accordingly, this makes it possible to absorb an amount of change in shape of the power-supplying member 100 due to the thermal expansion.

SECOND EMBODIMENT (Configuration of Power-Supplying Member)

Hereinafter, descriptions will be provided for a power-supplying member according to a second embodiment of the present invention with reference to FIG. 4. The following descriptions will focus mainly on what makes the Second embodiment different from the first embodiment.

Figure 4:
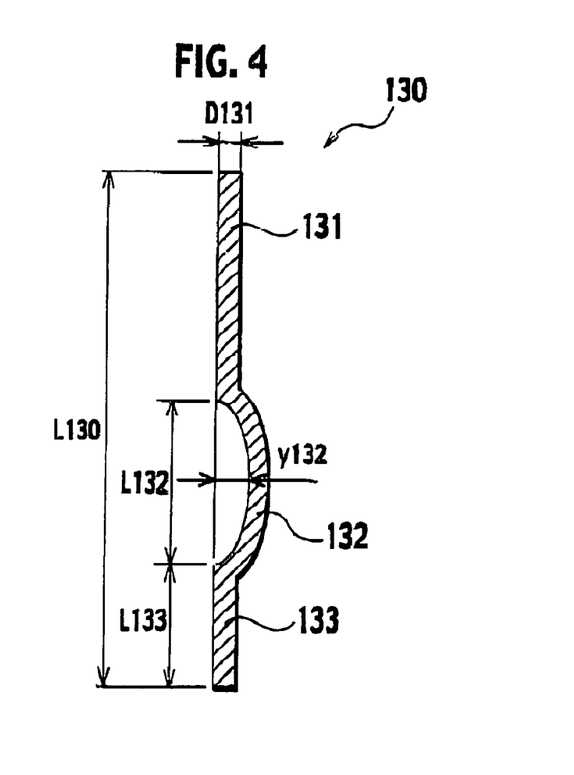
FIG. 4 is a side view of a power-supplying member according to second embodiment of the present invention.

In the case of the second embodiment, as shown in FIG. 4, a thermal-expansion absorbing member 132 is provided with a curved portion having a amount of bend y132 which is not smaller than 0.1 [mm]. The amount of bend y132 means the distance from the centerline of a first rod-shaped member 131 and a second rod-shaped member 133 in the longitudinal direction to the thermal-expansion absorbing member 132. The thermal-expansion absorbing member 132 is not shorter than 3 [mm] in length L132 in the longitudinal direction. When necessity for maintaining a certain level of hardness of the power-supplying member 130 is taken into consideration, it in desirable that the length L132 should be not shorter than 5 [mm], but should be equal to, or shorter by 10 [mm] than, the length L130. The amount of bend y132 is not smaller than 0.1 [mm], but not larger than 20 [mm]. However, for the purpose of maintaining the hardness of the power-supplying member 130 and because of space of hollowed part in the tubular supporting member, it is desirable that the amount of bend y132 should be not smaller than 0.5 [mm], but should be not larger than 10 [mm].

(Method of Manufacturing Power-Supplying Member)

Descriptions will be provided for a method of manufacturing the power-supplying member.

In manufacturing the power-supplying member, first of all, a rod-shaped member obtained by integrating the first rod-shaped member 131, the thermal-expansion absorbing member 132 and the second rod-shaped member 133 is produced. Next, the resultant rod-shaped member is pressed against a mold with a curved portion having an amount of bend y132 which is not smaller than 0.1 [mm]. Thereby, the thermal-expansion absorbing member 132 is formed. The power-supplying member 130 can be produced in this manner.

As is clear from the above description, according to the second embodiment of the present invention, the power-supplying member 130 can be provided with a structure having spring properties, or a structure capable of causing the thermal-expansion absorbing member 132 to easily buckle, while maintaining the hardness of the power-supplying member 130 as a whole without necessitating change in the cross-sectional form of the thermal-expansion absorbing member 132. This is because the thermal-expansion absorbing member 132 is provided with the curved portion having the amount of bend y132 which is not smaller than 0.1 [mm]. As a result, the thermal-expansion absorbing member 132 can adequately shrink or buckle in response to change in shape due to thermal expansion. Accordingly, this makes it possible to absorb an amount of change in shape of the power-supplying member 130 due to the thermal expansion, and to improve reliability of the heating apparatus.

THIRD EMBODIMENT (Configuration of Power-Supplying Member)

Figure 5:
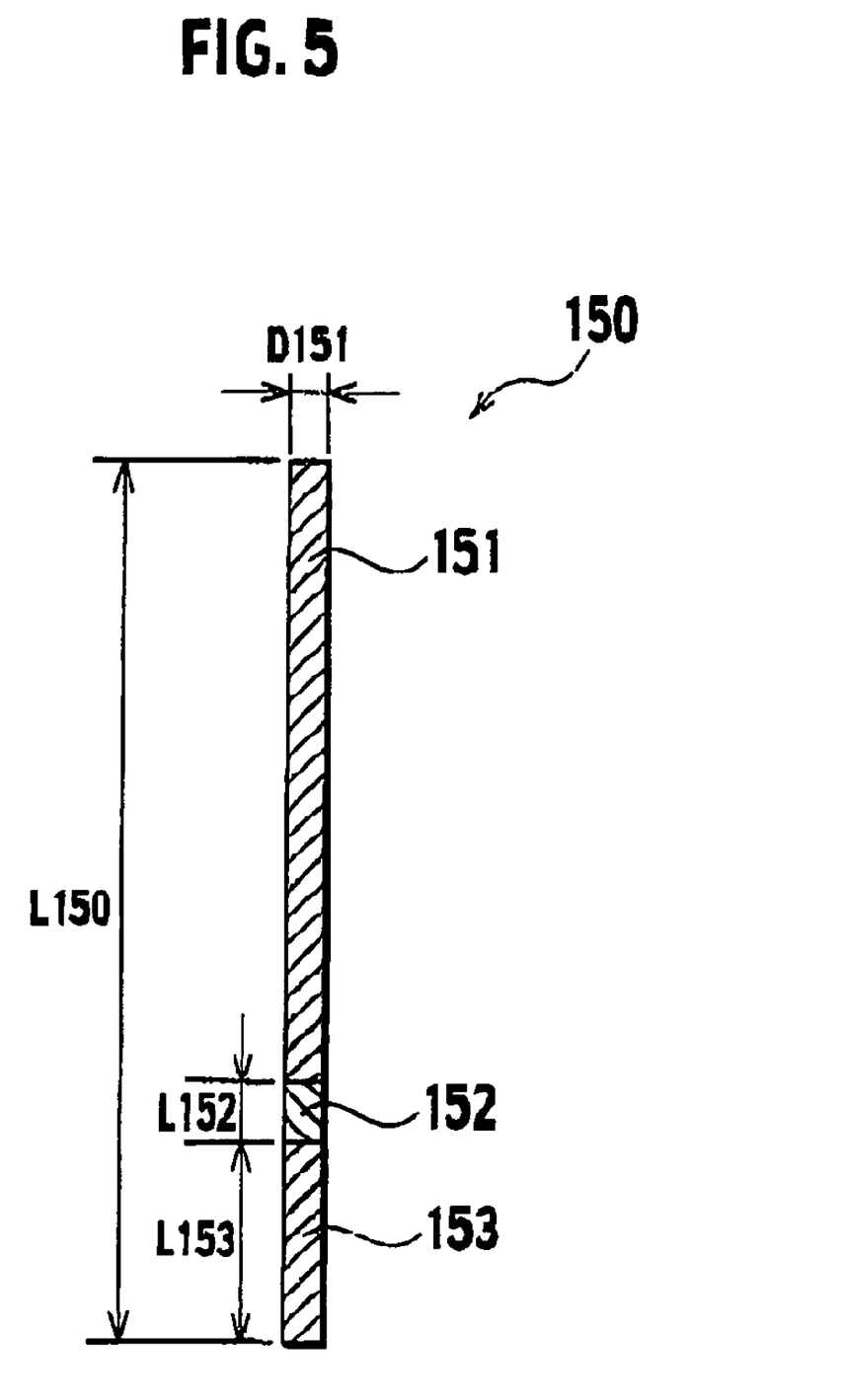
FIG. 5 is a side view of a power-supplying member according to third embodiment of the present invention.

Hereinafter, descriptions will be provided for a power-supplying member according to a third embodiment of the present invention with reference to FIG. 5. The following descriptions will focus mainly on what makes the third embodiment different from the first embodiment.

In the case of the third embodiment, the thermal-expansion absorbing member 152 is formed from a member haying a Young's modulus which is not 50 [Gpa] or more larger than a Young's modulus of a first rod-shaped member 151 and a second rod-shaped member 153. Specific combination examples of members are described in the following examples. The length L152 of the thermal-expansion absorbing member 152 is not shorter than 0.1 [mm], but not longer than 50 [mm]. For the purpose of maintaining the hardness of the power-supplying member 150, however, it is more desirable that the length L152 should be not shorter than 0.3 [mm], but not longer than 30 [mm].

(Method of Manufacturing Power-Supplying Member)

Descriptions will be provided for a method of manufacturing the power-supplying member.

In manufacturing the power-supplying member, the thermal-expansion absorbing member 152 is fixed to the first rod-shaped member 151 and the second rod-shaped member 153 by welding, soldering or friction welding. Thereby, the power-supplying member 150 can be produced. Otherwise, the thermal-expansion absorbing member 152 is fixed to the first rod-shaped member 151 and the second rod-shaped member 153 by caulking, press fitting, shrink fitting, or screwing. Thereby, the power-supplying member 150 can be produced.

As is clear from the above description, according to the third embodiment of the present invention, the thermal-expansion absorbing member 152 is formed from a member having a Young's modulus which is not 50 [Gpa] or more larger than a Young's modulus of a first rod-shaped member 151 and a second rod-shaped member 153. As a result of this, the thermal-expansion absorbing member 152 can shrink and can adequately shrink in response to thermal expansion. Accordingly, this makes it possible to absorb an amount of change in shape of the power-supplying member 150 due to the thermal expansion. Consequently, the power-supplying member 150 can further improve reliability of the heating apparatus.

OTHER EMBODIMENT AND MODIFIED EXAMPLES

Figure 6:
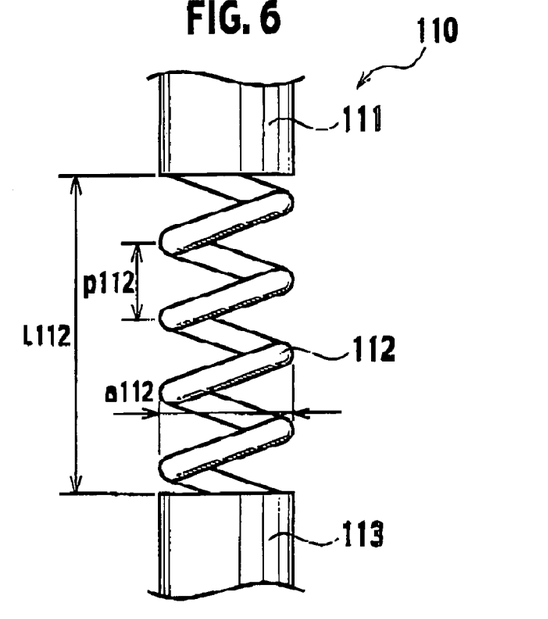
FIG. 6 is a side-view of a power-supplying member according to other embodiment of the present invention.
Figure 7:
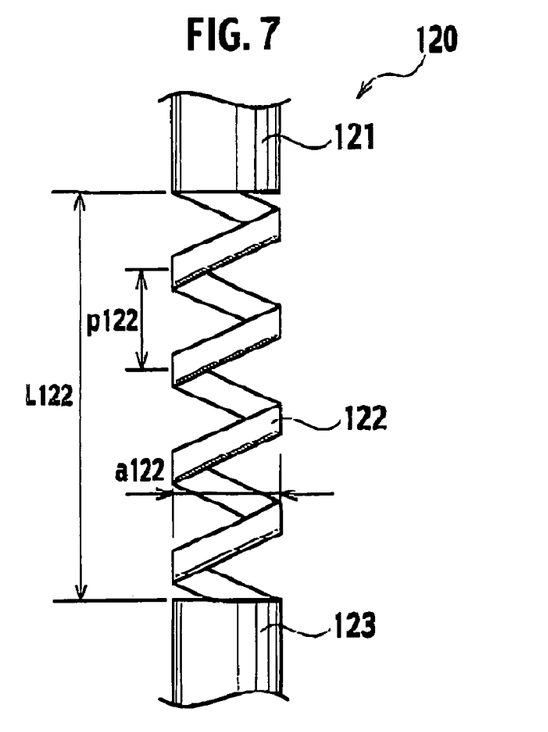
FIG. 7 is a side view of a power-supplying member according to other embodiment of the present invention.

It should be noted that the present invention is not limited to the aforementioned embodiments. The present invention is capable of various modifications. For example, as shown in FIG. 6, a modification of the present invention may be a power-supplying member 110 characterized in that the thermal-expansion absorbing member 112 is a member formed by coiling a rod-shaped member with a spiral structure. In addition, as shown in FIG. 7, another modification of the present invention may be a power-supplying member 120 characterized in that the thermal-expansion absorbing member 122 is a member formed by coiling a thin-plate member with a spiral structure. In accordance with these modifications, the thermal-expansion absorbing member can be provided with a structure having spring properties. Accordingly, this makes it possible for the thermal-expansion absorbing member to shrink adequately in response to thermal expansion, and to thus absorb an amount of change in shape of the power-supplying member due to the thermal expansion. Accordingly, the power supply member makes it possible to improve reliability of the heating apparatus.

(Application Example of the Power Supply Member)

Figure 8:
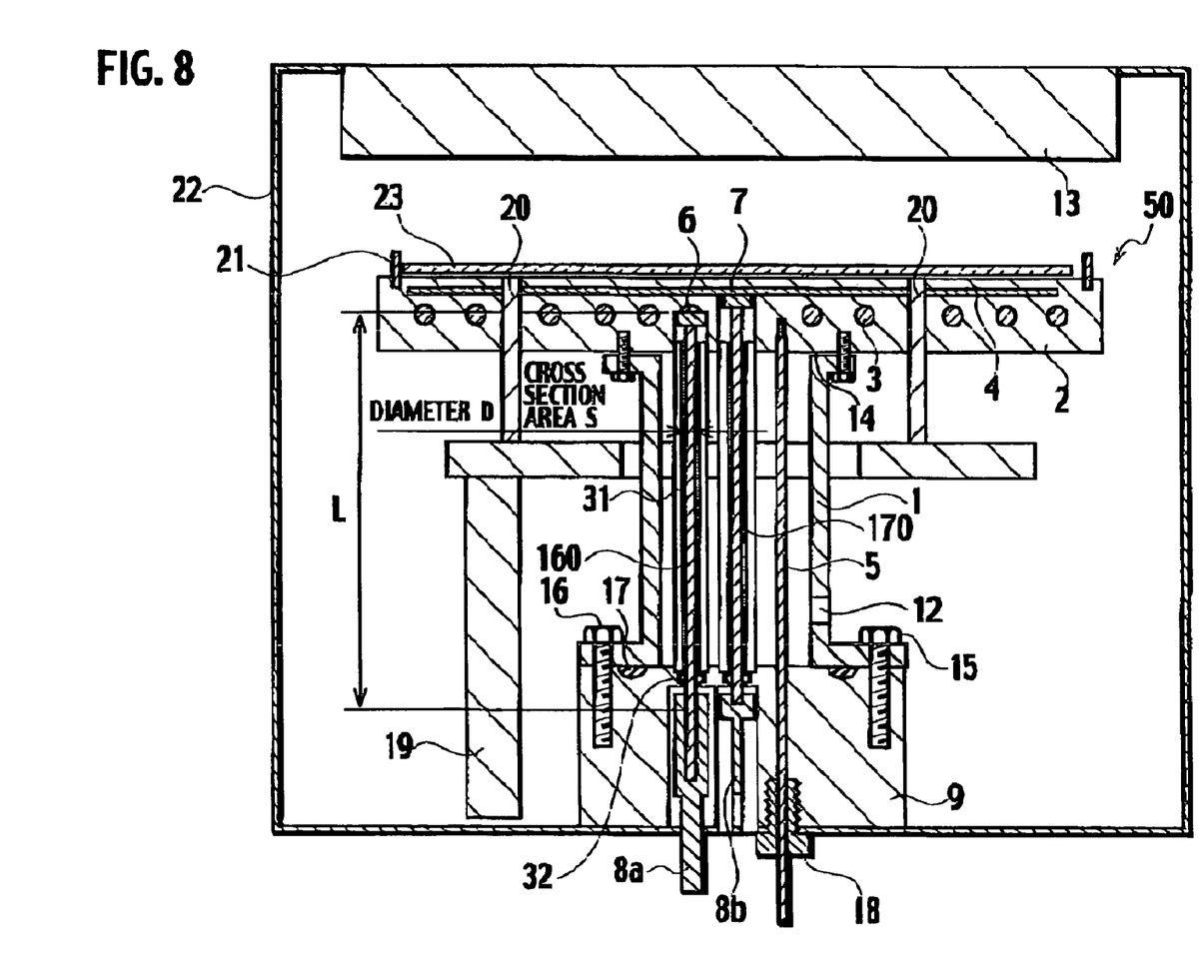
FIG. 8 is a cross-sectional view of heating apparatus according to an embodiment of the present invention.

The power supply member of the present invention can be applied to a heating apparatus as shown in FIG. 8 for example, The heating apparatus 50 shown in FIG. 8 includes a supporting member 1, a ceramic base 2, a heating resistor 3, a radio-frequency electrode 4, a probe 5 for measuring temperature a first terminal 5, a second terminal 7, connectors 8a and 8a, a cooling shaft 9, a power-supplying member 160, and a radio-frequency power-supplying member 170. The heating resistor 3 and the radio-frequency electrode 4 are embedded in the ceramic base 2. A substrate heating plate is provided with a heating plate on which a wafer 23 is placed. The ceramic base 2 includes holes in which the power-supplying member 160 and the radio-frequency power-supplying member 170 are respectively inserted. The holes extend to the first terminal 6 and the second terminal 7 from a joint surface 14 which is opposite to the substrate heating plate of the ceramic base 2. For this reason, parts respectively of the first terminal 6 and the second terminal 7 are exposed.

A plate-shaped base, such as a disc-shaped base, can be used as the material for the ceramic base 2. In addition, the ceramic base 2 can be made of ceramics, metals, composite material composed of a ceramic and a metal, or the like. For example, the ceramic base 2 is made or aluminum nitride (AlN), alumina ($Al_2O_3$), silicon nitride (SiN), silicon carbide (SiC) sialon (SiAlON), aluminum (Al), an aluminum alloy, a composite composed of an aluminum alloy and aluminum nitride, a composite composed of an aluminum alloy and SiC, and the like.

It is desirable that the ceramic base 2 should be made of aluminum nitride (AlN), alumina ($Al_2O_3$), silicon carbide (SiC) and silicon nitride (SiN). It is more desirable that the ceramic base 2 should be made of aluminum nitride (AlN) and alumina ($Al_2O_3$) which have a relative density not lower than 95 [%]. In addition, it is the most desirable that the ceramic base 2 should be made of aluminum nitride which has a higher thermal conductivity and a relative density not lower than 95 [%] Accordingly, this makes it possible to provide the ceramic heater 50 exhibiting excellent heat resistance and corrosion resistance.

The heating resistor 3 and the radio-frequency electrode 4 are embedded in the ceramic base 2. Power is supplied to the heating resistor 3 from the power-supplying member 160, and thus the heating resistor 3 generates heat. The heating resistor 3 is connected to the first terminal 6. Specifically, the heating resistor 3 is connected to the first terminal 6 by caulking, soldering, or screwing. In addition, the heating resistor 3 is connected to the power-supplying member 160 through the first terminal 6, and thus receive the power supply.

Power is supplied to the radio-frequency electrode 4 from the radio-frequency power-supplying member 170, and thus the radio-frequency electrode 4 generates heat. Power with a radio frequency is supplied to the radio-frequency electrode 4 and an upper radio-frequency electrode 13 fixed to the upper wall of the chamber. Thereby, a high voltage can be applied, at high temperature, to a material gas or a cleaning gas between the radio-frequency electrode 4 and the upper radio-frequency electrode 13. Accordingly, the material gas or the cleaning gas is turned into a plasma state. The radio-frequency electrode 4 is connected to the second terminal 7. Specifically, the radio-frequency electrode 4 is connected to the second terminal 7 by caulking, soldering or screwing. The radio-frequency electrode 4 is connected to the radio-frequency power-supplying member 170 through the second terminal 7, and thus the radio-frequency electrode 4 receives the power supply.

The heating resistor 3 and the radio-frequency electrode 4 are made of a pure metal or an alloy selected from the group consisting of tantalum, molybdenum (Mo), tungsten (W), niobium, (Nb), tungsten carbide (WC), platinum, rhenium, and hafnium. No restriction is imposed on the form of the heating resistor 3 and the radio-frequency electrode 4. Examples of the form include: a form which is formed by printing a print paste including powder of a refractory material) and forms of a thin film, a filament, a coiled, a mesh, and a plate which are formed by a physical deposition method and, the chemical vapor deposition method.

A curled pattern and a meshed pattern or the like can be used as the pattern for the heating resistor 3 and the radio-frequency electrode 4. The power-supplying member 160 and the heating resistor 3 are connected with each other though the first terminal 6. The radio-frequency electrode 4 and the radio-frequency power-supplying member 170 are connected with each other through the second terminal 7. The first terminal 6 and the second terminal 7 are made of molybdenum, niobium or the like. Surfaces respectively of the first terminal 6 and the second terminal 7 may be coated with gold or nickel. The first terminal 6 and the second terminal 7 may be globular or columnar.

The power-supplying member 160 is disposed to the hollowed part in the tubular supporting member 1, and supplies power to the heating resistor 3 as the power supplied object. The heating resistor 3 is embedded in the ceramic base 2 supported by the supporting member 1. The radio-frequency power-supplying member 170 is disposed to the hollowed part in the tubular supporting member 1, and supplies power to the radio-frequency electrode 4 as the power supplied object. The radio-frequency electrode 4 are embedded in the ceramic base 2 supported by the supporting member 1.

The power-supplying member 160 and the radio-frequency power-supplying member 170 are disposed to the hollowed part in the insulating sleeve 31 in order not to contact with an adjacent power-supplying member. In addition, O-ring seal 32 made of heat-resistant fluororubber is disposed between the power-supplying member 160 or the radio-frequency power-supplying member 170 and the cooling shaft 9, thereby hermetically holding a chamber.

Each of the power-supplying member 160 and the radio-frequency power-supplying member 170 includes a first rod-shaped member connected to the power supplied object, a second rod-shaped member connected to the power supply, and a thermal-expansion absorbing member disposed between the first rod-shaped member and the second rod-shaped member. The thermal-expansion absorbing member shrinks in the longitudinal direction in response to changes in shape of the first rod-shape member and the second rod-shaped member due to thermal expansion.

The first rod-shaped member of the power-supplying member 160 is connected to the hearing resistor 3 through the first terminal 6. In addition, the second rod-shaped member of the power-supplying member 160 is connected co the power supply through the connector 8*a*. The first rod-shaped member of the radio-frequency power-supplying member 170 is connected to the radio-frequency electrode 4 through the second terminal 7. In addition, the second rod-shaped member of the radio-frequency power-supplying member 170 is connected to the power supply through the connector 8*b*.

The supporting member 1 comprises a tubular hollowed part, and contains the power-supplying member 160 and the radio-frequency power-supplying member 170 in the hollowed part. The supporting member 1 is joined to the joint surface 14 which is opposite to the substrate heating plate of the ceramic base 2. The material of the supporting member 1 is any one of a ceramic and a metal which have corrosion resistance to a halogen-based corrosive gas. In addition, it is desirable that the material of the supporting member 1 should be of the same type as that of the ceramic base 2.

In a case where the material of the supporting member 1 is a metal, it is desirable that the material should be a nickel-base alloy, such as stainless steel, or an aluminum alloy. It is more desirable that the material should be inconel which is heat-resistance nickel-base alloy. The supporting member 1 is joined to the ceramic base 2 by direct joining, such as solid phase welding, or mechanical joining, such as solder joining and screw-fixing. In the case where the supporting member 1 is joined to the ceramic base 2 by mean of solid-phase welding, solid-liquid joining and solder joining, metallic parts disposed to the hollowed part in the supporting member 1 can be protected from the halogen-based corrosive gas.

Furthermore, in the case where the supporting member 1 is joined to the ceramic base 2 by mean of screw-fixing, if at least one gas-introducing hole 12 is provided to a lower part of the supporting member 1, this makes it possible to protect the metallic parts from the halogen-based corrosive gas. The halogen-based corrosive gas to be filled to the hollowed part of the supporting member 1 through such a gas-introducing hole 12 goes into the hollowed part from the lower part of the supporting member 1. For this reason, the temperature of the halogen-based corrosive gas is low enough for the gas to be less active neutral molecules. Accordingly, it makes it harder for the metallic parts to be corroded by the halogen-based corrosive gas. The gas-introducing hole 12 is not needed in the case of other joining means such as solid-phase welding, solid-liquid joining and solder joining. T Moreover, the heating apparatus can be provided with electrodes for electrostatic chucks, and the like, as electrodes. These electrodes for electrostatic chucks are used for generating electrostatic attraction by power supply, and for thus adsorbing a substrate. No specific restriction is imposed on intended use of the heating apparatus according to the present invention. However, examples or the intended use include chemical vapor deposition apparatuses, physical vapor deposition apparatuses, etching apparatuses, baking apparatuses, curing apparatuses for coaters. Furthermore, in a case where the power-supplying member attached to the ceramic base is held in a high-temperature environment and is fixed at its two ends, it does not matter that a modified example is a heating apparatus including the supporting member for supporting the ceramic base in addition to the power-supplying member.

EXAMPLES

Hereinafter, more detailed descriptions will be provided for the present invention giving examples. The present invention is not limited to the following examples at all. In the examples, a heating apparatus as shown in FIG. 8 was produced by following procedure. Specifically, first of all, a ceramic base obtained by embedding molybdenum coils, as a heating resistor, in powder made of aluminum nitride was produced. The ceramic base was formed with a thickness of 10 [mm], and with a diameter $\phi$ of 320 [mm]. Next, wafer-fixing pins for fixing a wafer were produced of alumina. Subsequently, a supporting member made of inconel was produced, and was joined to the ceramic base by screw fixing. The supporting member was formed with a length of 200 [mm]. Next, three power-supplying members and one thermocouple probe were disposed to the hollowed part in the supporting member. The three power-supplying members were covered with aluminum tubes for the purpose of securely insulating the power-supplying members. The thermocouple probe was a probe for measuring the temperature of the heating resistor. Then, cyclic tests were conducted by use of the heating apparatus thus produced. Specifically, the pressure of the nitrogen gas in the chamber was set at 10 [mTorr], and the temperature of the heating resistor in the chamber was set at 500 [° C.]. To this end, the temperature was raised at a rate of 10 [° C./min]. After the temperature of the heating resistor reached 500 [° C.], the temperature was dropped to 200 [° C.] at a rate of 10 [° C./min]. This cycle was repeated 1000 times, and the heating apparatus was observed.

Example 1

Figure 9A:
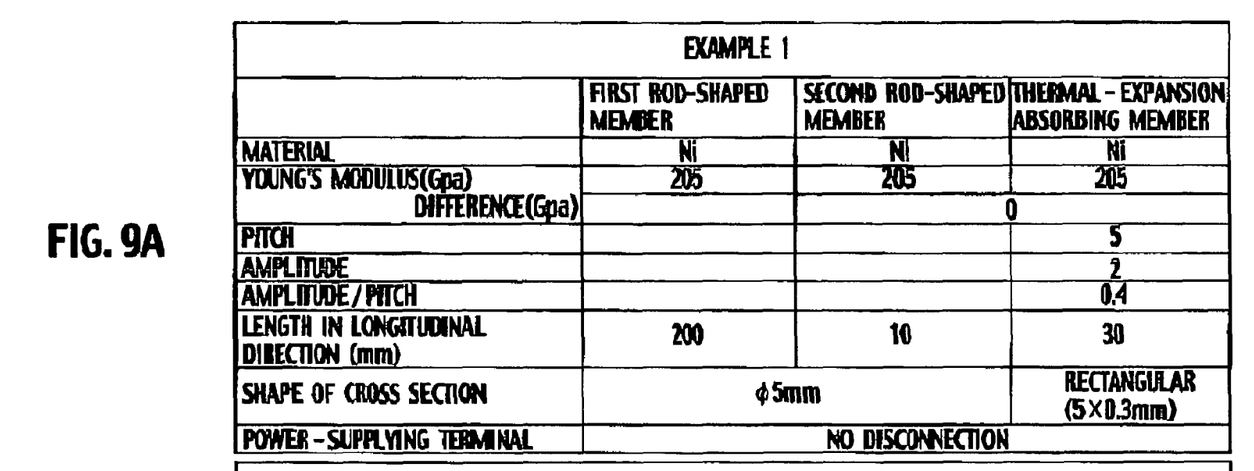
FIGS. 9A, 9E, and 9C are results of evaluating terminal disconnection after cyclic test according to examples 1, 2, and 3 of power-supplying member.
Figure 9B:
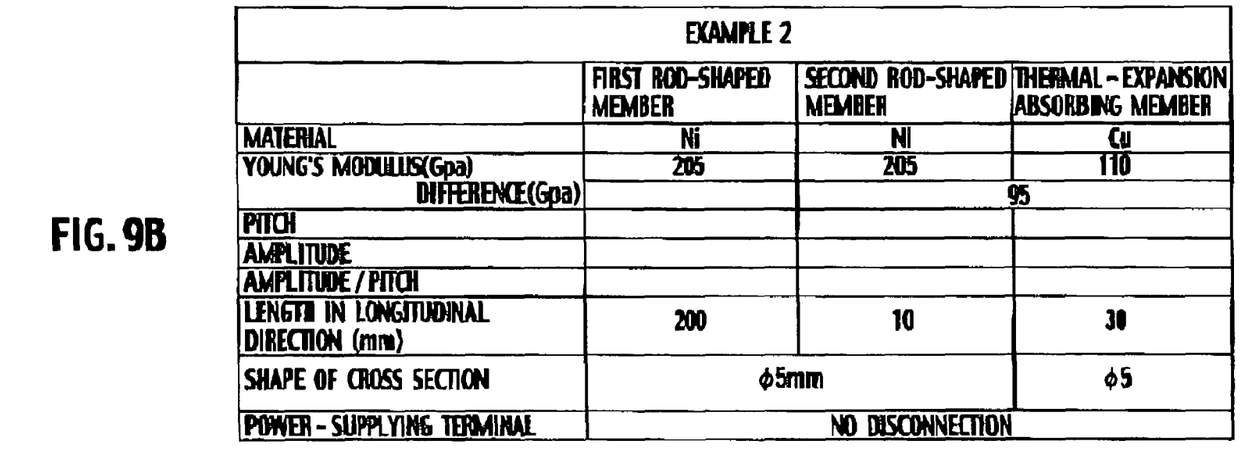

In example 1, a first and second rod-shaped member which comprise the power-supplying member was formed from Ni which Young's modulus was 205 [Gpa] as shown in FIG. 9A. The length of the first and second rod-shaped member in the longitudinal direction was 200 [mm] and 10 [mm] respectively. The diameter $\phi$ of the cross section of the first and second rod-shaped member in the axial direction was 5 [mm]. A thermal-expansion absorbing member which comprises the power-supplying member was formed from Ni as same as the first and second rod-shaped member. The thermal-expansion absorbing member was made so that the pitch p, amplitude a, and the ratio a/p became 5, 2, and 0.4 respectively. The length of the thermal-expansion absorbing member in the longitudinal direction was 30 [mm]. The cross-sectional shape of the thermal-expansion absorbing member in the axial direction was rectangular having size of 5*0.3 (thickness) [mm]. After the cyclic test, it was observed whether or not the joint parts had been loosened. In the heating apparatus provided with the power-supplying members according to example 1, no terminal disconnection was found.

Example 2

In example 2, a first and second rod-shaped member which comprise the power-supplying member was formed from Ni which Young's modulus was 205 [Gpa] as shown in FIG. 9B. The length of the first and second rod-shaped member in the longitudinal direction was 200 [mm] and 10 [mm] respectively. The diameter $\phi$ of the cross section of the first and second rod-shaped member in the axial direction was 5 [mm]. On the other hand, the thermal-expansion absorbing member was formed from Cu which Young's modulus was 110 [Gpa]. In the other words, the thermal-expansion absorbing member was formed from member which Young's modulus was 95 [Gpa] smaller than Young's modulus of the first and second rod-shaped member. The diameter $\phi$ of the cross section of the thermal-expansion absorbing member was 5 [mm]. After the cyclic test, it was observed whether or not the joint parts had been loosened. In the heating apparatus provided with the power-supplying members according to example 2, no terminal disconnection was found.

Example 3

Figure 9C:
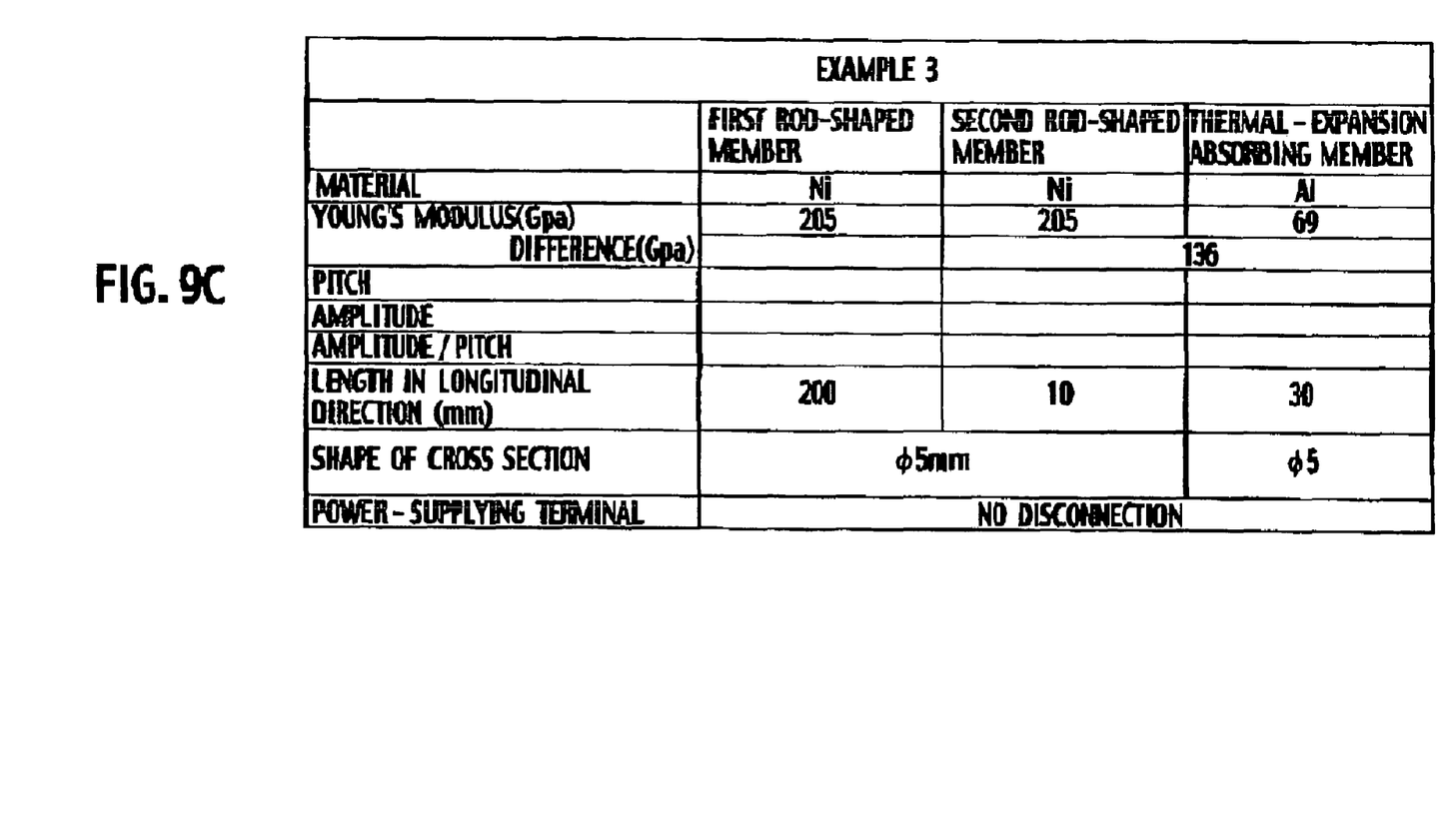

In example 3, the power-supplying member was formed by the same procedure as example 2 except the following point as shown in FIG. 9C The thermal-expansion absorbing member was formed from Al which Young's modulus was 69 [Gpa]. In other words, the thermal-expansion absorbing member was formed from member which Young's modulus was 136 [Gpa] smaller than Young's modulus of the first and second rod-shaped member. After the cyclic test, it was observed whether or nor the joint parts had been loosened. In the heating apparatus provided with the power-supplying members according to example 3, no terminal disconnection was found.

Comparative Example 1

Figure 10A:
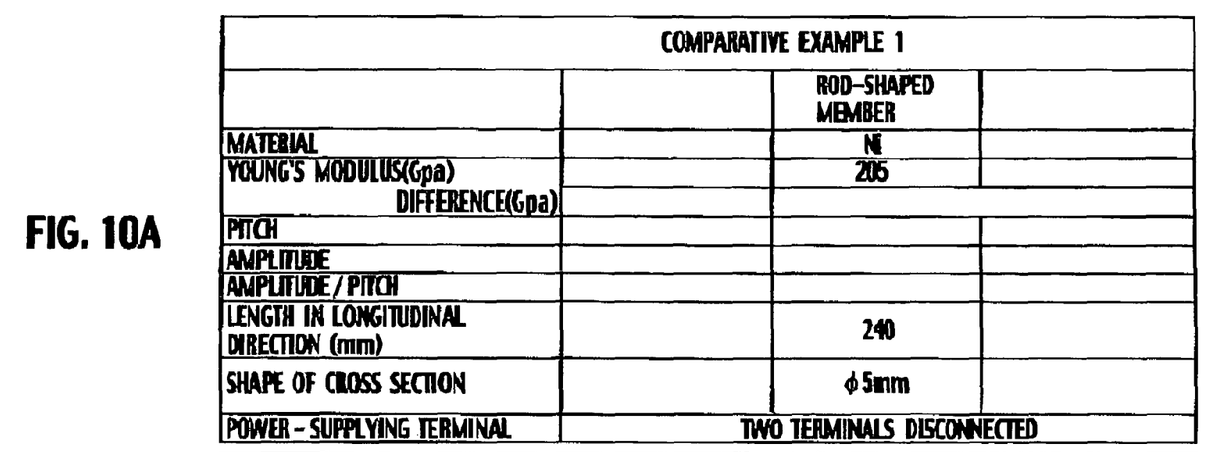
FIGS. 10A and 10B are results of evaluating terminal disconnection after cyclic test according to comparative examples 1 and 2 of power-supplying member.

In comparative example 1, the power-supplying member was formed only from rod-shaped member, and the thermal-expansion absorbing member was not provided as shown in FIG. 10A. The rod-shaped member is formed from Ni which Young's modulus was 205 [Gpa]. The length of the rod-shaped member in the longitudinal direction was 240 [mm]. The diameter $\phi$ of the cross section of the rod-shaped member in the axial direction was 5 [mm]. After the cyclic test, it was observed whether or not the joint parts had been loosened. In the heating apparatus provided with the power-supplying members according to comparative example 1, it was found that two power supplying terminals had been disconnected.

Comparative Example 2

Figure 10B:
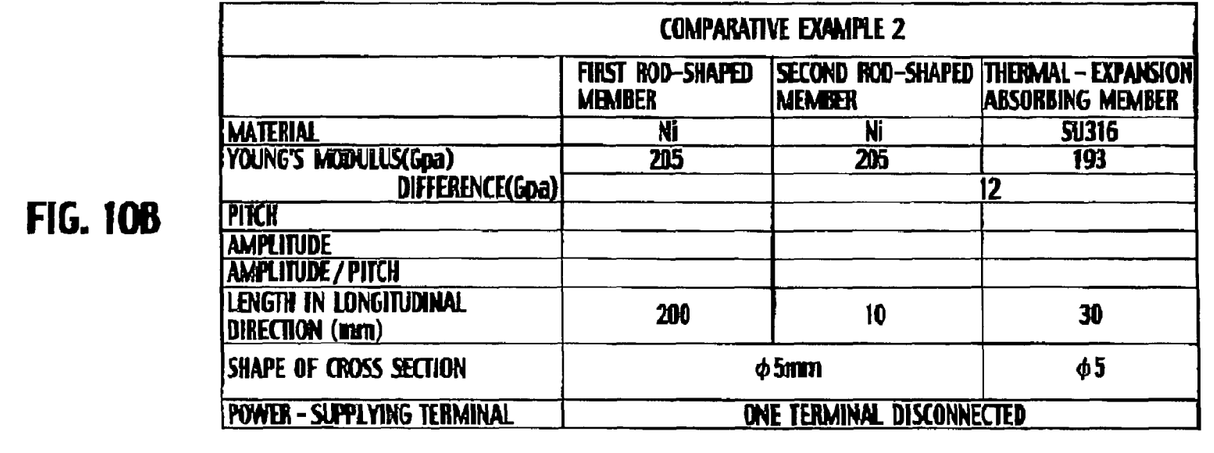

In comparative example 2, the power-supplying member was formed by the same procedure as example 2 except the following point as shown in FIG. 10B. The thermal-expansion absorbing member was formed from SU316 which Young's modulus was 193 [Gpa] In the other words, the thermal-expansion absorbing member was formed from member which Young's modulus was 13 [Gpa] smaller than that of the first and second rod-shaped member. After the cyclic test, it was observed whether or not the joint parts had been loosened. In the heating apparatus provided with the power-supplying members according to comparative example 2, it was found that one power-supplying terminal had been disconnected.

Although the invention has been described above by reference to certain embodiments of the invention, the invention is not limited to the embodiments described above. Modifications and variations of the embodiments described above will occur to those skilled in the art, in light of the teachings. The scope of the invention is defined wills reference to the following claims.

What is clamed is:

1. A power-supplying member, which is disposed in a hollowed part of a tubular supporting member, and which supplies power to at least one of a heating resistor and an electrode which are embedded in a ceramic base supported by the supporting member, the power-supplying member comprising:
   a first rod-shaped member connected to a power-supplied object;
   a second rod-shaped member connected to a power supply; and
   a thermal-expansion absorbing member, which is disposed between the first rod-shaped member and the second rod-shaped member, and which shrinks in a longitudinal direction in response to changes in shape of the first rod-shaped member and the second rod-shaped member in the longitudinal direction due to thennal expansion,
   wherein the thermal-expansion absorbing member is a thin-plate member having alternating series of convex and concave bending portions in the longitudinal direction, each bending portion extending along a direction orthogonal to the longitudinal direction, and
   wherein the ratio of distance between a convex bending portion and an adjacent concave bending portion in a direction orthogonal to the longitudinal direction to distance p between a convex bending portion and the next convex bending portion in the longitudinal direction is not smaller than 0.2, but not larger than 2.

2. The power-supplying member according to claim 1, wherein the thermal-expansion absorbing member includes a curved portion.

3. A power-supplying member, which is disposed to a hollowed part in a tubular supporting member, and which supplies power to at least one of a heating resistor and an electrode which are embedded in a ceramic base supported by the supporting member, the power-supplying member comprising:
   a first rod-shaped member connected to power-supplied object;
   a second rod-shaped member connected to power supply; and
   a thermal-expansion absorbing member, which is disposed between the first rod-shaped member and the second rod-shaped member, and which shrinks in a longitudinal direction in response to changes in shape of the first rod-shaped member and the second rod-shaped member in the longitudinal direction due to thermal expansion,
   wherein the thermal-expansion absorbing member is formed from a member which Young's modulus is 50 [Gpa] or more smaller than Young's modulus of the first and second rod-shaped member.

4. The power-supplying member according to claim 3, wherein the thermal-expansion absorbing member is a member formed in any one of a structure spiraling a rod-shaped member, a structure spiraling a thin-plate member, and a structure which the thin-plate member has alternating series of convex and concave bending portions in the longitudinal direction, each bending portion extending along a direction orthogonal to the longitudinal direction.

5. A heating apparatus comprising:
   a ceramic base in which at least one of a heating resistor and an electrode is embedded;
   a tubular supporting member which supports the ceramic base; and
   a power-supplying member, which is disposed to a hollowed part in the supporting member, and which supplies power to at least one of the heating resistor and the electrode,
   wherein the power-supplying member comprises: a first rod-shaped member connected to power-supplied object; a second rod-shaped member connected to a power supply; and a thermal-expansion absorbing member, which is disposed between the first rod-shaped member and the second rod-shaped member, and which shrinks in a longitudinal direction in response to changes in shape of the first rod-shaped member and the second rod-shaped member in the longitudinal direction due to thermal expansion,
   wherein the thermal-expansion absorbing member is a thin-plate member having alternating series of convex and concave bending portions in the longitudinal direction, each bending portion extending along a direction orthogonal to the longitudinal direction, and
   wherein the ratio of distance between a convex bending portion and an adjacent concave bending portion in a direction orthogonal to the longitudinal direction to distance p between a convex bending portion and the next convex bending portion in the longitudinal direction is not smaller than 0.2, but not larger than 2.

* * * * *

UNITED STATES PATENT AND TRADEMARK OFFICE
CERTIFICATE OF CORRECTION

PATENT NO. : 7,525,071 B2
APPLICATION NO. : 11/406084
DATED : April 28, 2009
INVENTOR(S) : Yoshinobu Goto and Hideyoshi Tsuruta

It is certified that error appears in the above-identified patent and that said Letters Patent is hereby corrected as shown below:

Column 13

*Line 39*: change "thennal" to --thermal--

Signed and Sealed this

Thirtieth Day of June, 2009

JOHN DOLL
*Acting Director of the United States Patent and Trademark Office*